United States Patent [19]
Pot et al.

[11] Patent Number: 5,691,635
[45] Date of Patent: Nov. 25, 1997

[54] PROBE IDENTIFICATION SYSTEM FOR A MEASUREMENT INSTRUMENT

[75] Inventors: René Paulus Maria Pot, Enschede; Heinrich Peter Dijkstra, Almelo, both of Netherlands

[73] Assignee: Fluke Corporation, Everett, Wash.

[21] Appl. No.: 593,760

[22] Filed: Jan. 29, 1996

[51] Int. Cl.$^6$ .................................................. G01R 1/04
[52] U.S. Cl. .......................... 324/115; 324/130; 324/601
[58] Field of Search ....................................... 324/115, 658, 324/402, 72.5, 482, 601, 130

[56] References Cited

U.S. PATENT DOCUMENTS

| | | |
|---|---|---|
| 4,401,949 | 8/1983 | Gold .......................... 324/402 |
| 4,467,273 | 8/1984 | Rudolph et al. ............... 324/65 R |
| 4,672,306 | 6/1987 | Thong ........................ 324/72.5 |
| 4,764,879 | 8/1988 | Campbell ..................... 364/482 |

Primary Examiner—Sandra L. O'Shea
Assistant Examiner—Barry C. Bowser
Attorney, Agent, or Firm—George T. Noe

[57] ABSTRACT

An auxiliary device (such as probe or the like) identification system for measuring instruments (such as oscilloscopes or voltmeters or the like) incorporates a commercially-available containing stored personality identification information, that is interrogated by the measuring instrument to establish correct operating mode, setup, and scaling to measure electrical signals provided by the auxiliary device. The measuring instrument includes an RF generator, a transceiver, and a demodulator to extract the stored personality information from the transponder.

3 Claims, 2 Drawing Sheets

PROBE IDENTIFICATION SYSTEM FOR A MEASUREMENT INSTRUMENT

BACKGROUND OF THE INVENTION

This invention relates generally to instrument probes, and in particular to a probe identification system for measuring instruments such as oscilloscopes, multimeters, and the like, include processing circuitry and controls to allow a user to establish a measurement mode, measurement parameter range, and signal scaling so that accurate measurements may be made of electrical phenomena in the form of signals applied to an input connector. A wide variety of auxiliary devices or "probes" are commercially available to allow a user to connect an electrical signal from its source to the input connector. These so-called probes are sold as instrument accessories and include, for example, low-voltage probes, high-voltage probes, current probes, signal-attenuation probes, and transducers which convert mechanical energy (heat, vibration, etc.) to electrical energy.

Use of probes with measuring instruments often results in set-up and interpretation errors. Any signal conditioning by the probe before the electrical signal reaches the measuring instrument input connector has to be taken into account by the user in selecting the various operating control settings and in interpreting the measurement results. For example, users of 10X attenuation probes, which are commonplace for use with oscilloscopes, must mentally multiply the displayed amplitudes by a factor of ten. Users of temperature probes must select the appropriate operating mode, range, and scale units to give a correct reading in degrees of temperature rather than volts.

The problem of errors caused by not properly matching the instrument to the probe have long been recognized, and many attempts have been made to automate and simplify instrument use. As an example, as early as the 1960s attempts were made at reducing interpretation errors by providing identification of 10X attenuation probes through additional electrical contacts at the input connector which sensed the coding provided by the probe. Because such electrical contacts add complexity and are subject to reliability problems, attempts have been made to eliminate such electrical contacts by providing impedance-sensing mechanisms to establish probe identity. More recently, so-called automatic oscilloscopes have been developed which have input circuitry that is capable of detecting the character and magnitude of an input signal and automatically establishing operating mode and ranges, as well as scale factors. However, such automatic oscilloscopes are expensive, and the frequency of error is increasing as lesser technically trained users are operating the equipment.

SUMMARY OF THE INVENTION

In accordance with the present invention, an auxiliary device identification system for a measuring instrument includes a transponder associated with the probe that is interrogated by a transceiver in the measuring instrument, so that auxiliary device personality information may be transferred to the measuring instrument for identification purposes, without the need for electrical contacts.

The transponder, which may suitably be a commercially-available device, contains a memory such as an EEPROM (electrically-erasable programmable read-only memory) into which personality or identification information is stored. When activated by an RF field, the transponder is powered up, and the stored information is retrieved under the control of an internal clock. The stored information is in the form a serial stream of digital data which is utilized to amplitude modulate the carrier frequency of the RF field.

In a preferred embodiment of the present invention, a transceiver within the measuring instrument includes an RF generator which produces an approximate 120 kilohertz RF carrier frequency signal which is applied to a transmit/receive coil. When a corresponding coil in the transponder comes within the field radiated from the transmit/receive coil, the stream of digital data is coupled across and separated from the carrier frequency, or demodulated, by a demodulator coupled to the transmit/receive coil. The demodulator comprises diodes and appropriate filtering to detect the envelope of the serial digital data. The serial digital data may then be converted to parallel form or decoded (for example, by an RS-232 decoder) for use by a microprocessor.

The microprocessor may use the identification information either to automatically establish a correct operating mode and scale factors or to generate on-screen menus to prompt a user to establish correct operating mode and scale factors to match the operating capabilities of the measuring instrument to auxiliary device.

It is therefore one object of the present invention to provide a novel auxiliary device identification system for a measuring instrument.

It is another object of the present invention to provide an auxiliary device identification system for a measuring instrument in which the instrument receives identification information without electrical contacts.

It is a further object of the present invention to eliminate instrument-setup and display-interpretation errors by providing a system properly to identify an auxiliary device for a measuring instrument so that correct operating parameters may be established.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
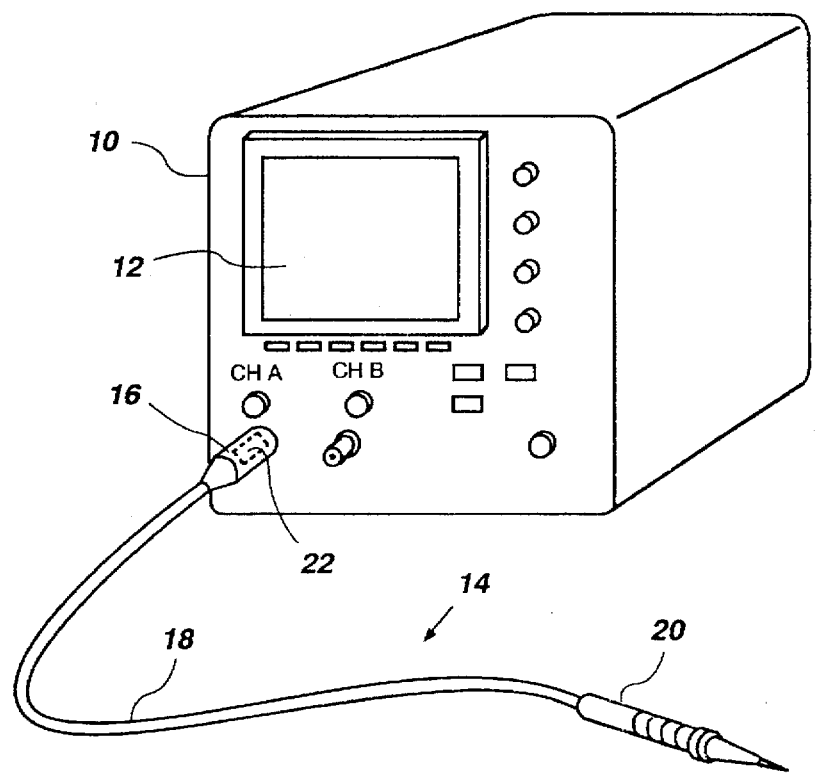
FIG. 1 shows a measuring instrument having a probe identification system in accordance with the present invention.

Referring to FIG. 1 of the drawings, there is shown a measuring instrument 10, such as an oscilloscope or the like, having a display screen 12 to provide a user with information relating to electrical phenomena being measured, such as, for example, the waveform of an electrical signal. Connected to an input connector of measuring instrument 10 is an auxiliary device or probe 14 having a base or connector end 16, a cable 18, and a probe body 20. While auxiliary device or probe 14 is shown as an oscilloscope probe, it should be understood that "probe" in the context of this description means any of a number of auxiliary devices or instrument accessories designed to couple an input signal to be measured to the measuring instrument, such as an active or passive voltage probe, a current probe or current clamp, a mechanical transducer, a temperature-sensing probe, or the like. A transponder 22, shown as a dashed line, includes a memory containing personality information relating to the probe. When interrogated by the measuring instrument 10, transponder 22 transfers its information to the measuring instrument which in turn may use the information to automatically set the instrument up to provide a scaled display in the correct units for the phenomena being measured, or alternatively, a pop-up menu may be provided on the display screen to prompt a user to establish the correct instrument settings. It should be pointed out that while transponder 22 is preferably located as shown in or on base 16 for convenience, and to keep the information stored therein from becoming separated from the probe, it is not essential to operation that transponder 22 be so located. The only requirement is that the transponder be positioned during operation within the field of a transmitter coil located within the measuring instrument 10. Also, it should be pointed out that the transponder 22 does not make electrical contact with the measuring instrument 10, and therefore, while coaxial BNC connectors are depicted, the type of actual connector used is irrelevant.

Figure 2:
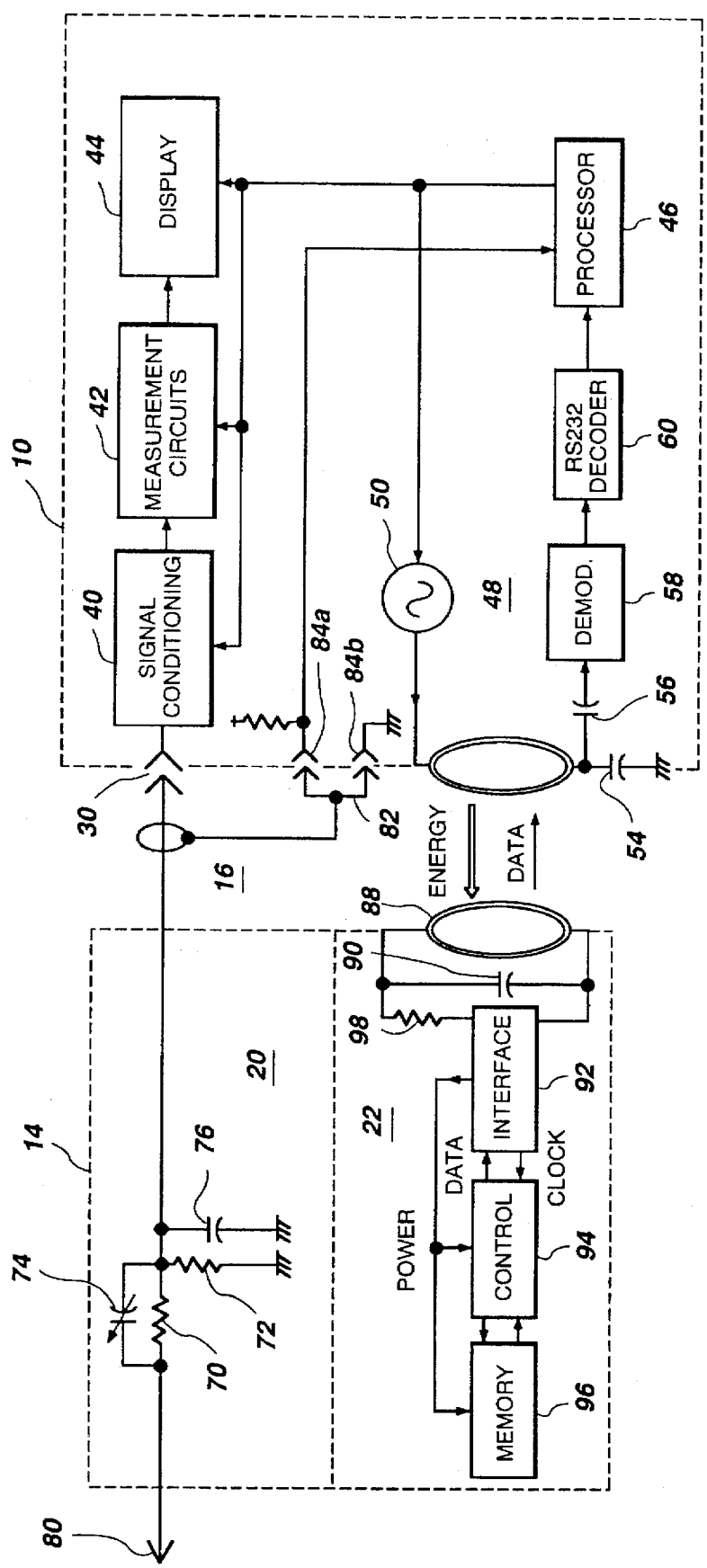
FIG. 2 is a block diagram of a probe identification system for measuring instruments in accordance with the present invention.

The measuring instrument and auxiliary device of FIG. 1 are shown in block diagram form in FIG. 2, wherein like elements have like reference numerals. A measurement instrument 10, encompassed by a dashed line, comprises an input connector 30 for receiving an input signal, a signal conditioning circuit 40, a measurement circuit 42, and a display device 44. Signal conditioning circuit 40 suitably may be conventional stepped attenuators, switched preamplifiers, and other circuitry to shape and scale an input signal for measurement. Measurement circuit 42 suitably may be conventional amplifiers, analog-to-digital converters, and other signal processing circuits well known to those skilled in the art. Display device 44 suitably may be a conventional liquid-crystal display (LCD) device or a cathode-ray tube (CRT). Associated with these circuits and not shown are conventional human-interface controls to allow a user to establish desired operating modes, as well as signal scaling and triggering. Overall instrument control, which may include automatic trigger and scale factor set-up, is provided by a processor 46, which may suitably be a microcomputer or a microprocessor.

A transmitter/receiver 48 comprises an RF signal generator 50, a transmit/receive coil 52 and associated capacitor 54 which together form a tuned resonant circuit 52–54, a coupling capacitor 56, a demodulator 58, and a decoder 60. In the preferred embodiment, the signal generator 50 produces a low-wattage 120-kilohertz signal which is applied to the tuned resonant circuit 52–54 (tuned to 120 kilohertz) so that coil 52 radiates an RF energy field. The demodulator 58 and decoder 60 will be discussed shortly in the context of overall operation with transponder 22.

An auxiliary device 14, encompassed by a dashed line, comprises for explanation purposes a probe 20 and a transponder 22. For the auxiliary device 14 illustrated here, probe 20 is a conventional attenuation probe with a frequency-compensated voltage divider comprising resistors 70–72 and capacitors 74–76 to attenuate a signal obtained at a probe tip 80 before application to input terminal 30 of instrument 10.

Associated with connector end 16 of auxiliary device 14 is a shorting bar 82 to connect contacts 84a and 84b together, grounding the bottom end of pull-up resistor 86, to notify processor 46 that an auxiliary device with transponder capability is connected to instrument 10. This allows RF generator 50 to be turned off, saving power, if it is not needed, and then turned on when a probe is connected. In the case of a multiple-input-channel instrument, such as a typical dual-input oscilloscope, processor 46 will detect which channel to energize. In the preferred embodiment, contacts 84a and 84b comprise a split ring around the receptacle, and shorting bar 82 is a metal ring around the connector that simply electrically shorts the two halves of the split ring together.

Transponder 22 in the preferred embodiment is a commercially-available Philips PCF 7931 xP/030612 RF transponder. It comprises a coil 88 and associated capacitor 90, which together form a tuned resonant circuit (again, tuned to 120 kilohertz to match the tuned resonant circuit in instrument 10), an interface module 92, a control unit 94, and a memory 96. Memory 96 in the Philips transponder is a 128-byte EEPROM, 96 bytes of which are available for programming with identification information, such as type of auxiliary device, instrument operating modes and scale factors, display units, and other information necessary to facilitate instrument setup and operation. In this particular transponder, interface 92 includes a switch that shorts the top and bottom of the tank circuit, or tuned resonant circuit, together. A small resistor 98 is included in the circuit path for current limiting. Other transponders are commercially available, as well, from manufacturers such as Texas Instruments and Motorola. It is up to the user to adapt these transponders to a given situation. The transponder, when operated, should be situated such that coil 88 is coupled with coil 52.

Figure 3:
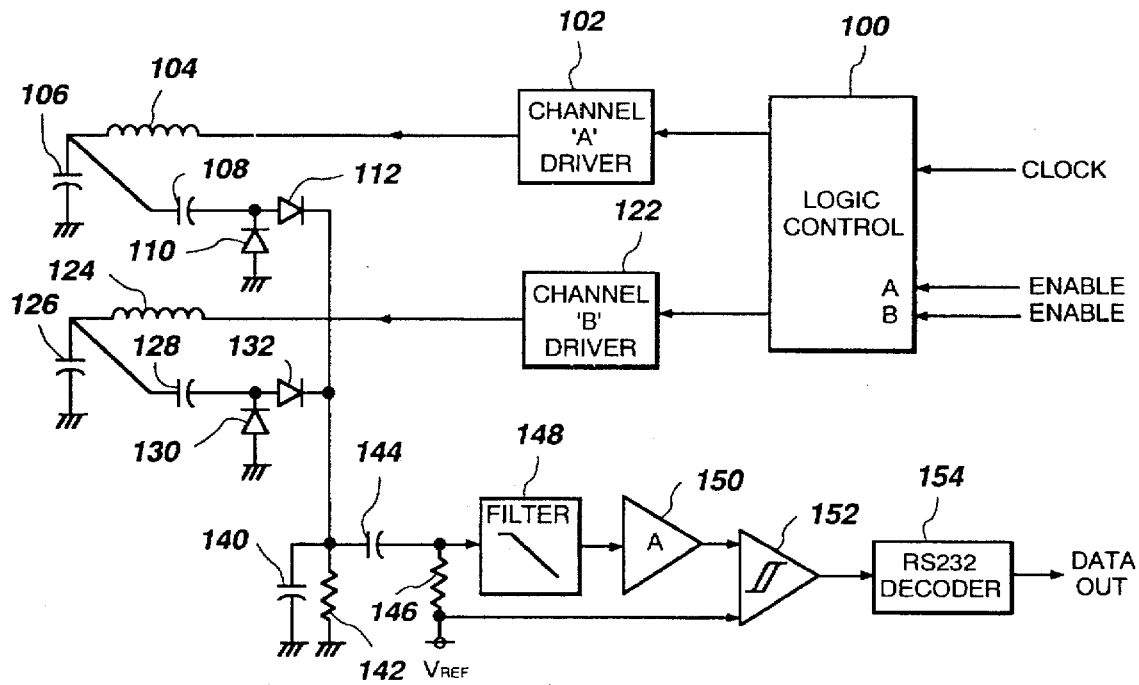
FIG. 3 is a detailed block diagram of a preferred embodiment of a transmitter-receiver portion of a probe identification in accordance with the present invention.

Operation of transmitter/receiver 48 and transponder 22 and is as follows: RF energy is radiated from coil 52 and coupled to coil 88, activating interface module 92 and providing power to the control unit 94 and memory 96. Memory 96, as mentioned earlier, is a 128-byte EEPROM organized in eight 16-byte blocks. Information specifically relating to the particular auxiliary device 14 is stored in memory 96. The contents of memory 96 are read out as a serial data stream, and in interface 92 these data operate to open and close the switch connected across the tuned resonant circuit 88–90. This action of course, changes the Q or impedance of the tuned resonant circuit 88–90 in transponder 22 in accordance with the data, which in turn changes the impedance of tuned resonant circuit 52–54 in measuring instrument 10 in such a manner that a 120-kilohertz signal, amplitude-modulated by the data stream, is coupled via capacitor 56 to demodulator 58. Demodulator 58 detects the envelope of the amplitude-modulated signal and removes the 120-kilohertz carrier signal. The resultant output of demodulator 58 is the data stream as read out of the memory 96. The data may be utilized directly by processor 46, or may be applied to a decoder, such as an RS-232 decoder, to provide programmed instructions to processor 46. FIG. 3 is a detailed block diagram of a preferred embodiment of the transmitter-receiver 48 within instrument 10. A system for a dual-channel oscilloscope having Channel A and Channel B inputs is shown. A logic control unit 100 receives a clock signal and A ENABLE and B ENABLE signals from a microprocessor. The Channel A transmit/receive circuit is made up of Channel A driver 102, coil 104, capacitors 106 and 108, and diodes 110 and 112. Likewise, the Channel B transmit/receive circuit is made of Channel B driver 122, coil 124, capacitors 126 and 128, and diodes 130 and 132. The cathodes of diodes 112 and 138 are connected together, and the common receiver circuitry includes an RC network 140–142, coupling capacitor 144, reference resistor 146, a bandpass filter 148, an amplifier 150, a comparator 152, and a decoder 154. Since the Channel A and Channel B circuits are identical, circuit operation will be described in conjunction with Channel A, with the understanding that the description also applies in a like manner to Channel B.

With Channel A selected by logic control circuit 100, clock signals are routed to Channel A driver 102. In the preferred embodiment, the clock signals are generated at a frequency of approximately 120 kilohertz. Channel A driver 102 produces the transmit RF signal at a frequency of about 120 kilohertz with sufficient energy to drive the transmit coil 104 (which is the same as coil 52 in FIG. 2). RF energy radiated by coil 104 is coupled to a transponder, such as transponder 22 of FIG. 2, and at the same time is amplitude modulated by a data stream retrieved from the transponder's memory. Diode 112 and RC network 140–142 rectify the received signal, effectively detecting the envelope of the data stream and removing the 120-kilohertz carrier frequency. The thus demodulated signal is applied to a bandpass filter 148 to remove any high-frequency aberration, and then is applied via amplifier 150 to one input of comparator 152, the other input of which is connected to a source of reference voltage. Comparator 152 shapes the demodulated and filtered data and applies the data to a decoder 154 to produce output data suitable to provide instructions to an associated computer, such as microprocessor 46 in FIG. 2. It should be pointed out the demodulated and filtered data could be utilized directly by the processor 46, with attendant decoding implemented in software.

While I have shown and described the preferred embodiment of my invention, it will be apparent to those skilled in the art that many changes made without departing from my invention in its broader aspects. It is therefore contemplated that the appended claims will cover all such changes and modifications as fall within the true scope of the invention.

What I claim as my invention is:

1. A system for identifying an auxiliary device for a measuring instrument, comprising:

an RF signal generator;

a transmit/receive coil coupled to the output of said RF generator to receive an RF signal and produce therefrom a field of radiated energy;

a transponder associated with said auxiliary device and positioned within said field of radiated energy and activated thereby, said transponder producing in response to said radiated energy a stream of identification digital data which amplitude modulates said RF signal at said transmit/receive coil;

a demodulator coupled to said transmit/receive coil to separate said identification digital data from said RF signal; and a processor for receiving said identification digital data.

2. A system in accordance with claim 1 further including a decoder coupled to the output of said demodulator to convert said identification digital data to data words for use by said processor.

3. A system in accordance with claim 1 further including an electrical connection between said auxiliary device and said measuring instrument to provide a probe-availability signal, and wherein said processor is responsive to said probe-availability signal to enable and disable said RF generator.

* * * * *